Nov. 26, 1968 F. A. LEITH 3,413,531

HIGH FREQUENCY FIELD EFFECT TRANSISTOR

Filed Sept. 6, 1966

INVENTOR
FRANK A. LEITH
BY Francis J. Thornton
ATTORNEY 3,413,531

HIGH FREQUENCY FIELD EFFECT TRANSISTOR

Frank A. Leith, Arlington, Mass., assignor to Ion Physics Corporation, Burlington, Mass.

Filed Sept. 6, 1966, Ser. No. 577,434
5 Claims. (Cl. 317—235)

ABSTRACT OF THE DISCLOSURE

A method of making a field effect transistor having a buried gate therein and the devices created thereby which consists of clearing the semiconductor surface, forming of an oxide layer thereon, converging selected regions in the body by bombarding the body with selected ions of an energy sufficient to penetrate the body to a predetermined depth and of a number sufficient to modify the conductivity and/or resistivity of the region of the body where the ions eventually come to rest.

This invention relates generally to semiconductor field effect transistors and more particularly to an ion implanted field effect transistor and the method of producing it.

The field effect transistor is a well known semiconductor device with characteristics quite similar to those of a vacuum tube pentode. The input impedance of the device is essentially that of a reverse biased junction and is therefore high in contrast to the normal transistors which are low impedance devices.

Basically the operation of the field effect transistor depends on the modulation of the cross-sectional area of a conductive channel, lying between two doped regions (the source and the drain), by a depletion region which penetrates the channel. The terminal or terminals used to vary the penetration of the depletion region is a gate. When the gate is biased so that the depletion region extends across the channel the condition known as cut-off occurs.

Devices of this type which were produced in the past have proved unsatisfactory in many aspects. Some problems encountered have been in the production techniques required to produce the unit while other problems exist in the characteristics of the finished device.

An example of the production difficulties can be seen by a description of the planar diffusion process used to fabricate these devices. This process requires the deposition of an oxide layer on a substrate and a series of steps which require the forming and closing of openings in this layer and the heating of the substrate to diffusion temperatures in the order of 1100° C. Each opening of oxide layer requires and necessitates critical optical alignment of masks and a slight misalignment can destroy an entire batch of units.

Also the device produced by this technique are subject to certain inherent limitations. For example, when the channel region of the devices is produced by diffusion an impurity gradient in the channel results. Furthermore the depth of diffusion must be carefully controlled since the saturation current of the devices is proportional to the channel thickness. Additionally diffused structures result in inherently increased input capacitances and thus lower input impedances. This occurs because of the high impurity concentration at the gate-source and gate-drain junctions compared to the considerably lower average concentration throughout the channel region.

In an effort to avoid these difficulties workers in the field turned to the so-called MOS technique or metal-oxide semiconductor technique. This process produced devices in which many of the operating characteristics were improved. However, in some ways the required production steps became more complex and critical for in addition to all the requirements of the prior art were added the steps of hepitaxial deposition and/or the necessity of depositing a critical thickness of oxide underlying the gate.

The present invention was devised to avoid the difficulties associated with the known prior art techniques and reduces the number of operations required to produce the device while producing devices which have better characteristics.

The present invention thus produces a novel field effect transistor which has a long channel with low channel resistance and high gain and high frequency characteristics.

The invention also produces a device having a gate immersed in the body which avoids the problem of surface contamination.

Broadly speaking, the present invention is directed towards a field effect transistor produced by ion implantation techniques which comprises a semiconductor body having a source, a drain, a channel, and a gate within the body below the channel and in line therewith.

Briefly described, the making of field effect transistors by the present invention comprises the cleaning of a semiconductor surface, the formation of an oxide layer thereon, conversion of the conductivity of selected regions by ion implantation through the oxide and the opening of the oxide to affixed leads to certain of the selected regions.

These and other features of the present invention may be more readily appreciated by a perusal of the following description taken in conjunction with the accompanying drawings wherein FIGURE 1 illustrates in schematic form the apparatus used to provide the ion implantation.

Figures 1, 2, 3, 4, 5, 6, 7:
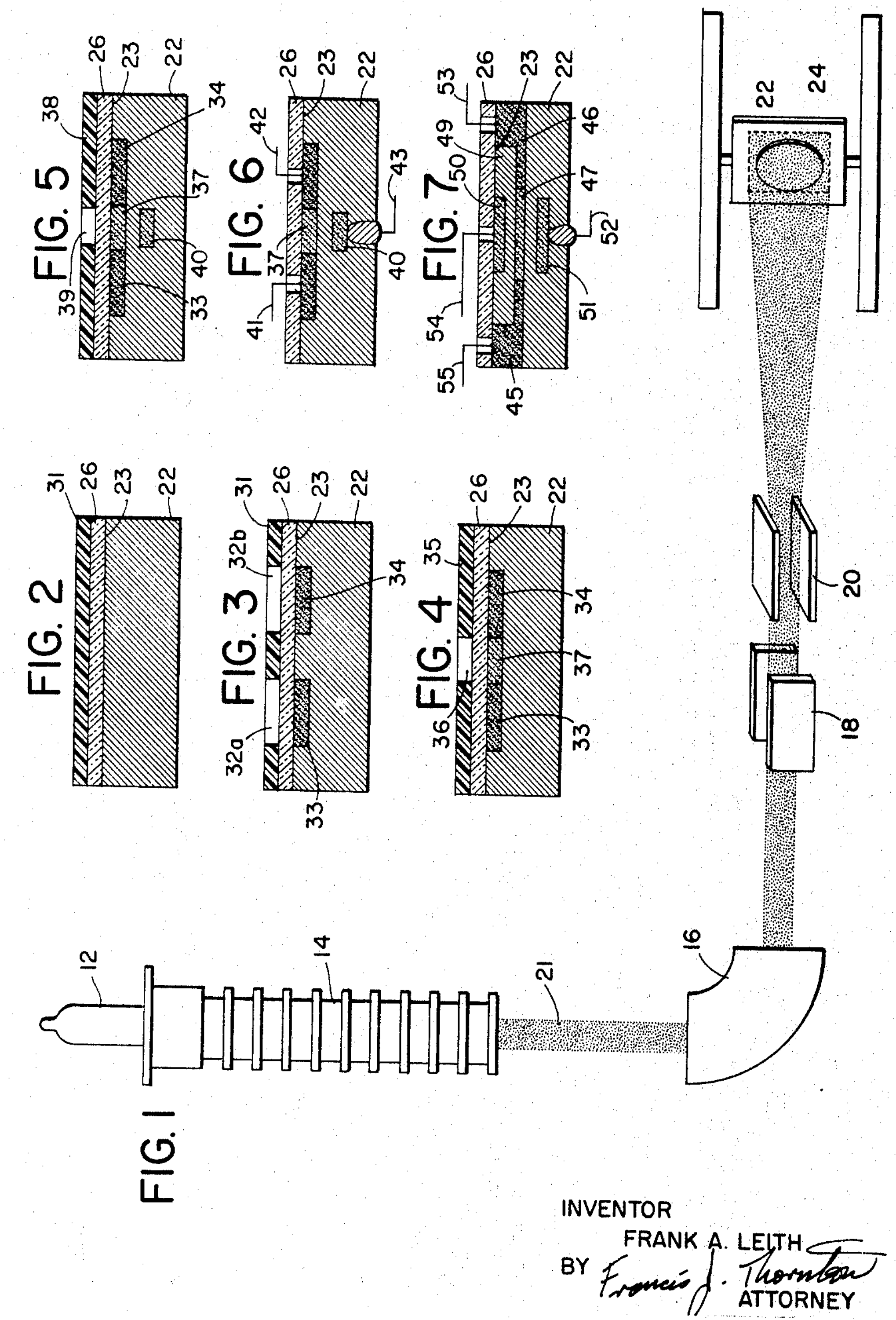
FIGURE 2 shows a body of semiconductor material having disposed thereon a layer of passivating material and photoresist.
FIGURE 3 shows the body of FIGURE 2 after ion implantation has been utilized to form the source and drain.
FIGURES 4 shows the body of FIGURE 2 following the implantation of the channel.
FIGURE 5 shows a view of the body of FIGURE 2 following implantation of the gate.
FIGURE 6 illustrates the completed structure of FIGURE 5 following the attachments of leads to the source, drain and gate
FIGURE 7 illustrates a two gate field effect resistor produced in accordance with the present invention.

FIGURE 1 is an illustration in schematic form of an apparatus which may be used for ion implantation in the present invention. The basic elements of the apparatus include an ion source 12 mounted atop an accelerator unit 14. From the accelerator tube 14 ions emerge and pass through a momentum analyzing system such as analyzing magnet 16. The ion beam emerging from the analyzing magnet 16 is passed through a deflection system which may be composed of horizontal beam scanner plates 18 and vertical beam scatter plates 20. The scanned beam emerges from the beam scanner plates and is directed upon a sample 22 of single crystal semiconductor material positioned such that the beam enters the sample at a non channeling angle. The sample 22 is mounted upon a plate 24.

The entire apparatus is enclosed in a so-called clean bench (not shown) to avoid the possibility of failing to irradiate the entire surface which might be caused by dust particle beam shadowing. It should also be noticed that implantation along crystallographic directions is deliberately avoided in order that channeling will not result. As is well known, channeling causes very deep ion penetration when the incident ray ion beam enters the material normal to a relatively open major plane and passes deep into this crystal. Such ions can cause marked deterioration of operation of certain of the devices subsequently fabricated.

Ion energies in the one hundred kev. to the two mev. range have proven especially suitable although ion beams of lower and higher energy have been used. It is generally desirable, however, to maintain ion energy levels above 80 kev. to prevent sputtering for should sputtering occur the surface layer of the sample would, of course, be destroyed.

As has been noted, conventional acceleration may be employed but electrostatic belt type generators such as those bearing the trademark Van de Graaff are most useful. This is because Van de Graaff accelerators are inherently capable of control in numerous parameters. Ion energy, ion current, integrated beam current and energy spread all may be closely controlled. By way of example the accelerator voltage may be controlled to within one kev. This represents a spread of only 0.33% at 300 kev. which correspond to a range spread when using P31 ions of only 13 angstroms in 4000 angstroms. Straggle in junction definition is primarily due to statistical variations in ion range and impurity movement during subsequent annealing. However, all factors can be closely controlled sufficiently well to control junction depth to within 0.1 microns.

Various details have been omitted from FIGURE 1 to permit easier understanding of the apparatus there illustrated. Actually the ion beam emerging from the accelerator 14 passes through a drift tube to the analyzing magnet 16. The magnet itself is of the momentum analyzing type. Also a second drift tube is utilized on the output side of the magnet as suitable electronic gear is used to provide the appropriate scanning voltages to the deflection plates 18 and 20. The sample holder itself is preferably made of stainless steel. Also the entire implantation apparatus should be enclosed by a concrete vault for radiation protection. Provision may also be made to heat or cool the sample holder to obtain various implantation temperatures. Preferably, however, the sample is cooled to liquid nitrogen temperatures.

FIGS. 2 through 6 illustrate sequential steps in the processing of a field effect transistor in accordance with the present invention. Illustrated in FIG. 2 is a body of silicon 22 having a surface 23 which has disposed therein a coating 26 of a passivating material such as silicon. This passivating coating 26 may be produced on surface 23 by any number of known techniques. For example, if silicon oxide is selected this may be thermally grown on sufare 23. In order to assure that ions are implanted only in selected portions of body 22 it is necessary that a suitable masking agent 31 be provided over the coating 26. This masking agent must be relatively easily applied and must provide good definition of the regions to be implanted. One suitable masking material is known to the art as photoresist. This agent 31 must be applied in a thick enough layer so as to prevent ions from penetrating therethrough. After application of agent 31 it is treated such that selected openings **32*a* and 32*b*** are provided therein as shown in FIG. 3.

Following the creation of these openings in mask 31 the slice is placed in the apparatus of FIG. 1 and bombarded with selected ions. For example, if body 22 is composed of high resistivity, P-type material in the order of 500–1000 ohm-cm., then phosphorous ions would be selected for implantation in order to produce N type source and drain regions 33 and 34. Conversely if body 22 is N type material boron ions would be selected to produce P type source and drain regions.

The apparatus irradiates the entire body 22, however, the ions enter body 22 only in regions 33 and 34 which underlie openings **32*a* and 32*b*. The ions are prevented from entering other regions of the body by mask 31. Sufficient ions of 100 kev. energy are implanted to convert regions 33 and 34 to .1 to .01 ohm-cm. N type material with a P-N junction lying between these regions and the body 22**.

Following production of the source and drain mask 31 is stripped off and a new mask 35 is provided over layer 26. This new mask 35 is provided with an opening 36 exposing the region between the source and drain. Once again the slice is exposed to irradiation by phosphorous ions and channel region 37 is produced as shown in FIG. 4. A sufficient number of 200 kev. ions are implanted in channel 37 to convert this region to N type material having a resistivity of 1 to 0.1 ohm.-cm. Higher energy atoms are used to produce channel 37 in order to assure that the channel junction is at the same depth as the source and drain junctions even though the channel has a lower implanted concentration of ions.

Following implantation of the channel 37 mask 35 is removed and still another mask 38 is provided over the layer 26. This mask has an opening 39 provided therein through which gate 40 may be implanted under channel 37. Because gate 40 must be placed below the channel region 37 it is necessary that much higher energy ions be used. The ions selected would have energies of at least 400 kev. and more probably have energies in the order of 2 mev. The particular energy used would depend on the desired gate depth below the junction. The conductivity of gate 40 should be about 10 times that of channel 37 thus it would in the described case range between 0.1 to 0.01 ohm.-cm.

By using ion implantation the gate 40 can be created in the body while leaving undisturbed the basic body material between it and the channel or the back surface of the unit. This occurs because the depth of penetration of the ions being implanted is a function of the energy of the beam, its flux, the orientation of the crystal lattice and the thickness of the passivating layer. By controlling these any depth of penetration may be obtained. Since the implanted ions penetrate straight into the body and do not move about after implantation the gate region will have sharp boundaries which give this region a box like appearance as depicted in the figures. When ions of only one energy level are implanted all the ions will be stopped in substantially the same region and will not stop elsewhere in the body. Thus by this technique a deeply buried gate region may be realized without affecting the resistivity of the material through which the ions passed. Because the body 22 is a regular crystal the ions pass through its lattice without affect to the lattice or the crystal resistivity. However, at the end of their range, due to the elastic collision and nuclear scattering the ions do cause radiation damage to the lattice. However, this damage is removed by the annealing step which moves the implanted ions into electrically active sites.

This achievement of a deep lying region withont affecting the surrounding material can only be accomplished by ion implantation and cannot be accomplished by any of the prior art techniques such as diffusion. In diffusion it is necessary that the dopent atoms be supplied from a diffusion source which can constantly supply a necessary amount of atoms. Such a source is required because as the atoms diffuse into the crystal it occurs randomly and in all directions thus some diffusing atoms moved faster than others while some diffuse out of the lattice through the surface which they previously entered. This causes the concentration to constantly fall in any one area and additional atoms must be supplied to maintain the desired concentration. For this reason the diffusion of atoms affects the resistivity of the material through which the atoms diffuse. It is for these reasons that in diffused devices the resistivity of the material separating the gate and the channel is determined not by the resistivity of the basic bulk material but by the diffusion of the impurity atoms. This directly affects the voltage breakdown since it is a function of the distance separating the drain from the gate and of the resistivity of the material in the separation which should be as high as possible.

Following implantation of gate 40 mask 38 is removed and a different mask (not shown) is applied to the layer 26 so that lead openings may be made in the layer 26. After fabrication of the lead openings leads 41 and 42 are connected to the source 33 and drain 34 respectively. A lead 43 is also provided on gate 40. This is accomplished by alloying a suitable metal 44 through the body 22 to gate 40 and attaching lead 43 to this alloy button 44. Alternately this connection to the gate 40 may be accomplished by the production of a "pipe," from the gate to the surface, by ion implantation.

The contacts to the source and drain regions may be formed in any one of several ways. The most commonly used method is evaporating metal upon the upper surface of the device during which process a certain amount of material is deposited through the openings provided in the photoresist layer and in the passivating layer. The layer of photoresist is then dissolved away using a suitable solvent. The evaporated metal layer breaks away adjacent to the contact areas leaving the material deposited in the holes provided in the passivating layer only. Suitable leads may then be attached to the contact areas by thermo compression bonding, ultrasonic welding, or any other conventional method. It is desirable after the implantation of ions has been completed to anneal the device to eliminate any damage caused by radiation. Generally if a temperature of approximately 750° is not exceeded in the annealing process radiation damage can be repaired without effect on the device. Actually temperatures from 300 to 500° C. are more than adequate to remove radiation damages but temperatures up to 750° held for a period of time ranging up to 16 hours are needed to supply the activation energy to place the majority of implanted ions in substitutional positions.

The field effect transistor produced by this device has minimal capacitance and yet permits the utilization of small pinch off voltages. This design further utilizes a gate of much higher conductivity than the channel causing the depletion area due to the gate voltage to remain in the channel and not in the gate. This provides maximum conductance change for a given gate source voltage.

Preferably the substrate utilized in the production of a field effect transistor in accordance with the present invention is of high resistivity material in order that the depletion due to the junction potentials be sufficient to keep the source substrate and drain substrate capacitance to a small value. The major source of capacitance then comes only from the source contact to substrate and drain contact to substrate capacitance. This capacitance can be reduced by using thick dielectrics of low dielectric constant between the contact and the substrate.

Because the ion implantation occurs through the passivating surface layer a high conductance buried layer can be formed while leaving a low conductivity layer between the buried layer and the surface. Since the passivating layer is not disturbed by the implantation, narrow channel widths next to the surface are possible with reproducible characteristics. These benefits are unattainable by either the diffusion or alloying techniques known to the prior art.

The utilization of a buried gate may be incorporated in the production of a two gate field effect transistor so that equal transconductance for the two gates may be obtained. The diffusion technique known to the prior art always resulted in unequal control for the two gates due to diffusion techniques which are substantially uncontrollable when operating with such narrow techniques and because it is impossible to completely diffuse all the material through the above areas.

A two gate device is shown in FIG. 7 wherein the source 45 and the drain 46 are separated by a channel 47 and a portion of the substrate 49 with one gate 50 being provided on the surface of the substrate region 49 above the channel 47 and with a second gate 51 being provided beneath the channel 47 and in line with and parallel to the first gate 50. This configuration provides many benefits well known to those skilled in the art such as transconductance benefits wherein the transconductance for both gates is equal and a considerable reduction in capacity.

This device would have contacts provided to both gates 50 and 51 and to the source and drains 45 and 46 respectively.

Having now described one embodiment of the present invention and since other embodiments may now become more apparent to those skilled in the art it is desired that the invention be limited only by the following claims wherein I claim:

1. A field effect transistor comprising a solid body of semiconductor material of a first conductivity type, said body having a selected resistivity, a first surface and an opposing second surface, a source region in said body and intersecting said first surface, a drain region in said body and intersecting said first surface, said source and said drain each having a conductivity different than the conductivity of said body, a channel connecting said source to said drain, said channel having the same conductivity as the conductivity of said source and the conductivity of said drain, a gate region, having a conductivity opposite to said channel, disposed within said body between said channel and said second surface in line with said channel, separated from said channel by a controlled distance, said gate further being separated from any surface of said body by portions of said body having said selected resistivity, said gate containing substitutional conductivity ions of said first conductivity type bombardment implanted in said gate and leads coupled to said source, said drain and said gate.

2. The device of claim 1 wherein said gate is smaller in area than said channel.

3. The device of claim 1 wherein said gate is substantially surrounded by said body of semiconductor material.

4. The device of claim 1 wherein said body has a high resistivity in the order of 500 to 1000 ohm-cm., said source and said drain regions each have resistivities in the order of .1 to .01 ohm-cm., said channel has a resistivity in the order of 1 to 0.1 ohm-cm., said gate has a resistivity about ten times lower than the resistivity of said channel and said gate is surrounded by material having a resistivity in the order of 500 to 1000 ohm-cm.

5. The device of claim 1 wherein said channel is disposed below said first surface and a second gate is provided between said channel and said first surface whereby said channel is sandwiched between said gates.

References Cited

UNITED STATES PATENTS

| | | | |
|---|---|---|---|
| 2,979,427 | 4/1961 | Shockley | 317—235.21 |
| 3,007,119 | 10/1961 | Barditch | 317—235.21 |
| 3,293,084 | 12/1966 | McCaldin | 317—235 |
| 3,316,131 | 4/1967 | Wisman | 317—235.21 |

JOHN W. HUCKERT, *Primary Examiner.*

JERRY D. CRAIG, *Assistant Examiner.*